United States Patent

[11] 3,629,662

[72] Inventors Edward P. Cattey
Wallingford;
Raymond H. Poturnicki, New Haven;
James J. Johnston, Cheshire; Walter J. Bedard, Meriden, all of Conn.

[21] Appl. No. 72,473
[22] Filed Sept. 15, 1970
[45] Patented Dec. 21, 1971
[73] Assignee Automatic Equipment Development Corporation
West Haven, Conn.

[54] ELECTRONIC COMPONENT WITH LEAD REVERSELY BENT FOR PLURAL TERMINAL CONNECTIONS
12 Claims, 6 Drawing Figs.

[52] U.S. Cl. .......... 317/118, 338/220
[51] Int. Cl. .......... H05k 5/02, H01c 1/14
[50] Field of Search .......... 29/630 A; 317/99, 118; 338/220; 339/147 R, 214 R, 215 R

[56] References Cited
UNITED STATES PATENTS

| | | | |
|---|---|---|---|
| 2,646,489 | 7/1953 | McArron .......... | 338/220 X |
| 2,898,572 | 8/1959 | Shinn .......... | 29/630 A X |

*Primary Examiner*—Lewis H. Myers
*Assistant Examiner*—Gerald P. Tolin
*Attorney*—McCormick, Paulding & Huber

ABSTRACT: A modular electronic component for releasable plugging connection in an associated electronic circuit and having a hollow housing containing an electronic element. The element has a body and includes a pair of leads which extend outwardly from opposite ends thereof. Each lead has one portion which extends beyond the body in one direction and toward one end of the housing and another portion which is bent in a reverse direction and extends beyond the body in the direction of the other end of the housing. Two plug receptacles are attached to each lead, each receptacle being exposed at an associated end of the housing.

INVENTORS
WALTER J. BEDARD
EDWARD P. CATTEY
JAMES J. JOHNSTON
RAYMOND H. POTURNICKI
BY McCormick, Paulding & Huber
ATTORNEYS

ELECTRONIC COMPONENT WITH LEAD REVERSELY BENT FOR PLURAL TERMINAL CONNECTIONS

BACKGROUND OF THE INVENTION

This invention relates to electronic components and deals more particularly with electronic components adapted for releasable connection in an associated electronic circuit. The general aim of the present invention is to provide improved insulated modular electronic components of the aforedescribed general type suitable for use as original or replacement parts in electronic circuits and the like.

SUMMARY OF THE INVENTION

In accordance with the present invention an improved modular electronic component is provided comprising a hollow housing containing at least one electronic element having a body and at least one lead extending from the body. The lead is bent in a particular manner to provide terminal portions for receiving connecting elements which are exposed at opposite ends of the housing for releasably connecting the component to an associated circuit.

DETAILED DESCRIPTION OF THE PREFERRED EMBODIMENTS

Figure 1:
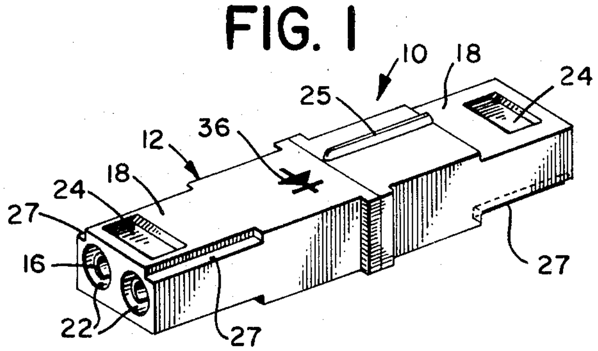
FIG. 1 is a perspective view of a modular electronic component embodying the present invention.
Figure 2:
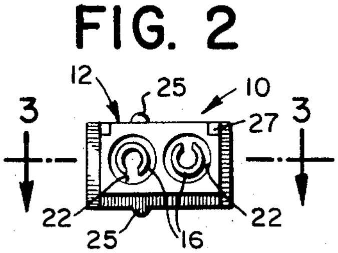
FIG. 2 is an end elevational view of the modular component of FIG. 1.
Figure 3:
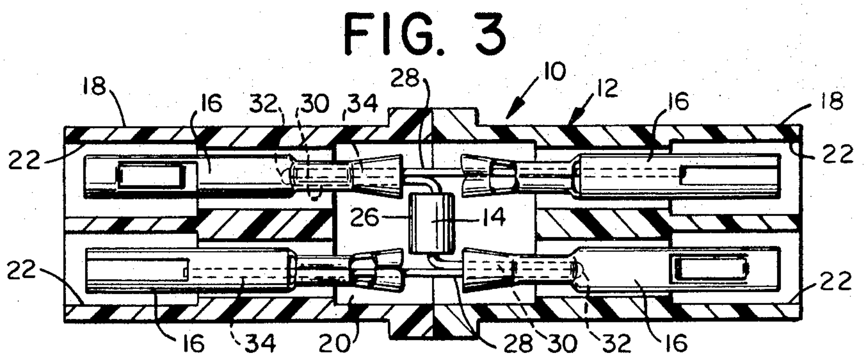
FIG. 3 is a somewhat enlarged sectional view taken along the line 3—3 of FIG. 2.
Figure 4:
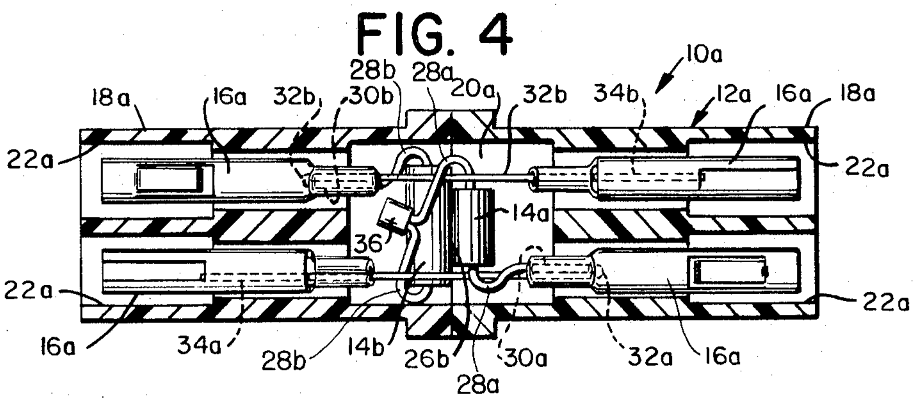
FIG. 4 is similar to FIG. 3 but shows another embodiment of the invention.
Figure 5:
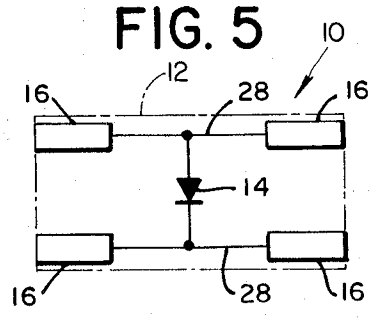
FIG. 5 is a schematic view of the modular electronic component of FIG. 1.

Turning now to the drawing and referring first to FIGS. 1-3, a modular electronic component embodying the present invention and adapted for releasable connection with an associated electronic circuit (not shown) is designated generally by the reference numeral 10. The component 10 is suitable for use in an electronic circuit as either an original or a replacement part and has a hollow housing indicated generally at 12 which contains at least one electronic element such as indicated at 14. A plurality of connecting elements 16 are exposed at opposite ends of the housing for releasably connecting the component to as associated circuit.

The form of the housing and the material from which it is made may vary, but preferably it is made from an electrical insulating material color-coded to indicate the nature of the electronic element or elements contained therein. In the illustrated case, the housing 12 is made of Nylon and has a generally rectangular block shape. More specifically, it comprises half-sections 18, 18 bonded together in end-to-end relation. Each half-section 18 comprises a Matnlock Housing, manufactured by AMP, Inc., Harrisburg, Penna., and modified, as necessary, to define a central chamber 20 adapted to receive and contain the element 14 when the housing sections 18, 18 are joined. A pair of cylindrical bores 22, 22 open through each end of the housing 12 and communicate with the chamber 20. Each half-section 18 is adapted to cooperate in releasable locking engagement with another part (not shown) connected to the circuit and has a recess 24 near its free end which cooperates with a locking element on the other part. A rib 25 and a pair of recesses 27, 27 formed on each half-section 18 are adapted to complement the other part to assure assembly in proper relation thereto.

The electronic element 14 comprises a diode which has a generally cylindrical body 26 and leads 28, 28 which extend from opposite ends thereof. Each lead 28 has one portion 30 which extends outwardly from the body in one direction and generally toward an associated end of the housing 12. Each lead also includes a generally U-shaped reverse bend portion 32 which comprises the continuation of the portion 30 and another portion 34 which comprises the continuation of the reverse bend portion 32. The portion 34 extends for some distance generally adjacent the portion 30 and beyond the body 26 in a direction opposite said one direction and toward the other end of the body 12. The reverse bend portion 32 and part of the portions 30 and 34 which comprise the continuation of the reverse bend portion form one terminal portion of the lead 28 to which one connecting element 16 is attached. The free end of the portion 34 forms another terminal portion of the lead 28 and another connecting element 16 is attached thereto.

Each connecting element 16 has an opening at its inner end for receiving an associated terminal portion of a lead 28. The connecting elements 16, 16 may, if desired, be soldered to the leads, but preferably and as shown, each connecting element has a portion thereof crimped into gripping engagement with an associated lead forming a solderless attachment thereto. Each connecting element 16 is received in an associated housing bore 22 and is exposed at an end of the housing. The connecting elements 16, 16 are adapted for releasable connection with associated mating connecting elements (not shown) which comprise part of an associated electronic circuit. In the illustrated case, each connecting element 16 includes a female receptacle portion adapted to receive a male connecting element in plugging engagement therein.

The element 14 is assembled with the connecting elements 16, 16 before the housing half-sections 18, 18 are bonded together in end-to-end relation. An appropriate symbol, such as the diode symbol 36 shown in FIG. 1, is preferably imprinted on the housing to indicate the nature of the assembled component.

Figure 6:
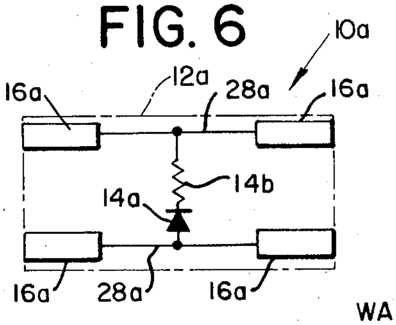
FIG. 6 is a schematic view of the modular electronic component of FIG. 4.

Considering now FIG. 6, another modular electronic component embodying the present invention is designated by the numeral **10*a*. The component 10*a* is similar in many respects to the component 10 previously described. Parts substantially identical to parts previously described bear the same reference numeral and a letter suffix and will not be hereinafter further described. The component 10*a* differs from the component 10 in that it includes a plurality of electronic elements electrically connected together. More specifically, the component 10*a* includes two electronic elements which comprise a diode 14*a* and a resistor 14*b* connected together in electrical series. The diode 14*a* has a generally cylindrical body 26*a* and includes a pair of leads 28*a*, 28*a* which extend from opposite ends of the body 26*a*. The outward appearance of the resistor 14*b* is very similar to that of the diode 14*a* and includes a generally cylindrical body 26*b* and leads 28*b*, 28*b*. The elements 14*a* and 14*b* are preferably arranged with the bodies thereof in generally side-by-side relation, as shown, to provide a compact package. The diode 14*a* has one lead 28*a* electrically connected to an associated lead 28*b* of the resistor. Preferably and as shown, a solderless connector 36 is crimped into gripping engagement with the free ends of the latter leads to form the connection therebetween. The other leads 28*a* and 28*b* are bent and joined to associated connecting elements 16*a*, 16*a*** in the manner previously described.

We claim:

1. A modular electronic circuit component for releasable connection with an electronic circuit and comprising a hollow housing, at least one electronic element contained within said housing and including a body and at least one lead connected to said body and extending therefrom, said one lead having one portion extending outwardly beyond said body in one direction and toward one end of said housing, a reverse bend portion comprising the continuation of said one portion, and another portion comprising the continuation of said reverse bend portion extending for some distance generally adjacent said one portion and in a direction opposite said one direction, said other portion extending beyond said body in said other direction toward the other end of said housing and terminating at a free end, said reverse bend portion and parts of said one and said other portion comprising the continuation of said reverse bend portion forming one terminal portion of said one lead, said free end comprising another terminal portion of said one lead, one connecting element attached to said one terminal portion and exposed at said one end of said housing, and another connecting element attached to said other terminal portion of said one lead and exposed at said other end of said housing, each said connecting elements being adapted for releasable connection with an associated mating connecting element comprising a part of the circuit.

2. A modular electronic circuit component as set forth in claim 1 wherein each said connecting element has an opening in the inner end thereof receiving an associated terminal portion therein and an inwardly crimped portion grippingly engaging said associated terminal portion.

3. A modular electronic circuit component as set forth in claim 1 wherein at least one said connecting element includes a female receptacle for receiving a male connecting element comprising a part of the circuit.

4. A modular electronic circuit component as set forth in claim 1 wherein said housing comprises half-sections bonded together in assembly.

5. A modular electronic circuit component as set forth in claim 1 wherein said housing is color-coded to indicate the nature of said one electronic element contained therein.

6. A modular electronic circuit component as set forth in claim 5 wherein said housing has a symbol imprinted thereon indicating the nature of said one electronic component contained therein.

7. A modular electronic component as set forth in claim 1 including means associated with said housing for releasably locking said component in connected relation with another part comprising a part of the electronic circuit.

8. A modular electronic component as set forth in claim 1 including another lead connected to said body and extending therefrom, said other lead having one portion extending outwardly beyond said body in one direction and toward an associated end of said housing, a reverse bend portion comprising the continuation of said one portion and another portion comprising the continuation of said reverse bend portion extending for some distance adjacent said one portion and in another direction opposite said one direction, said other portion of said other lead extending beyond said body in said other direction and terminating in a free end, said reverse bend portion and parts of said one and said other portion comprising the continuation of said reverse bend portion forming one terminal portion of said other lead, said free end comprising another terminal portion of said other lead, one connecting element attached to said one terminal portion of said other lead and exposed at said associated end of said housing, and another connecting element attached to said other terminal portion of said other lead and exposed at the opposite end of said housing.

9. A modular electronic component as set forth in claim 1 including a plurality of electronic elements electrically connected together, said one electronic element comprising one of said elements, said connected elements including another element having another lead connected to the body thereof and extending therefrom, said other lead having one portion extending outwardly beyond said other element body in one direction and toward an associated end of said housing, a reverse bend portion comprising the continuation of said one portion, and another portion comprising the continuation of said reverse bend portion extending for some distance adjacent said one portion and in another direction opposite said one direction, said other portion extending beyond said other element body in said other direction and terminating at a free end, said reverse bend portion and parts of said one and said other portion comprising the continuation of said reverse bend portion forming one terminal portion of said other lead, said free end comprising another terminal portion of said other lead, one connecting element attached to said one terminal portion of said other lead and exposed at said associated end of said housing, and another connecting element attached to said other terminal portion of said other lead and exposed at said other end of said housing.

10. A modular electronic component as set forth in claim 9 wherein said one electronic element comprises a diode and said other electronic component comprises a resistor.

11. A modular electronic component as set forth in claim 10 wherein said connected elements are connected together in electrical series.

12. A modular electronic component as set forth in claim 1 wherein said one electronic component comprises a diode.

* * * * *